United States Patent [19]
Noda

[11] Patent Number: 6,137,740
[45] Date of Patent: Oct. 24, 2000

[54] SEMICONDUCTOR MEMORY DEVICE CONFIGURED WITH I/O SEPARATION

[75] Inventor: Hideyuki Noda, Hyogo, Japan

[73] Assignee: Mitsubishi Denki Kabushiki Kaisha, Tokyo, Japan

[21] Appl. No.: 09/466,480

[22] Filed: Dec. 17, 1999

[30] Foreign Application Priority Data

Jun. 28, 1999 [JP] Japan .................................. 11-181194

[51] Int. Cl.[7] .................................. G11C 7/02; G11C 8/00
[52] U.S. Cl. ................ 365/207; 365/230.03; 365/230.08
[58] Field of Search .................. 365/230.03, 230.08, 365/207, 208, 190

[56] References Cited

U.S. PATENT DOCUMENTS 5,321,646   6/1994  Tomishima et al. ...................... 365/51
5,724,291   3/1998  Matano .................................. 365/207

OTHER PUBLICATIONS

"Ultra LSI Memory", K. Ito, Advanced Electronics Series, Nov. 5, 1994, pp. 165–167.

Primary Examiner—Trong Phan
Attorney, Agent, or Firm—McDermott, Will & Emery

[57] ABSTRACT

A common line shared by the sources of the transistors configuring a read gate is arranged in a sense amplifier region. A voltage control circuit is arranged at an intersection of the sense amplifier region and a subordinate decoder region. The voltage control circuit supplies to the common line a ground voltage in reading data and a voltage higher than the ground voltage in writing data. As such, erroneous read operation or current leakage does not occur when a read column select gate turns on in writing data.

14 Claims, 4 Drawing Sheets

SEMICONDUCTOR MEMORY DEVICE CONFIGURED WITH I/O SEPARATION

BACKGROUND OF THE INVENTION

1. Field of the Invention

The present invention relates generally to semiconductor memory devices and particularly to semiconductor devices configured with input/output (I/O) separation.

2. Description of the Background Art

In recent years there has been an increasing demand for rapid data transfer between a semiconductor memory device and a processor as the semiconductor memory device has been increasingly used in the field of graphics. An effective means to meet the demand is increasing the width of a data bus to thereby enhance data transfer rate. Furthermore, to enhance the operating frequency of the data bus, input and output buses that are separately provided, i.e., an I/O separation can often be adopted in a semiconductor memory device.

A dynamic random access memory (DRAM) with such I/O separation is disclosed, e.g., in *Advanced Electronics I-9 Ultra LSI Memory*, by Kiyoo Ito, Baihukan, Nov. 5, 1994, pp.165–167. The DRAM includes an input line pair, a write column select gate connected between the input line pair and a bit line pair, an output line pair, and a read column select gate connected between the output line pair and a bit line pair. The DRAM adopts direct sensing, directly detecting a potential difference appearing on a bit line pair to read data. As such, a pair of MOS transistors is connected between the read column select gate and a ground node. One transistor's gate is connected to one bit line and the other transistor's gate is connected to the other bit line.

In such a DRAM, data is read from a memory cell when the read column select gate turns on and simultaneously the pair of transistors sense the current potential difference on the bit line pair and the potential difference thus appears on the output line pair. In writing data into a memory cell, the write column select gate turns on and the current potential difference on the input line pair is transmitted to the bit line pair.

Such I/O separation is advantageous in readily providing an enhanced data transfer rate, since if data are randomly read and written the data read from memory cell and the data written to a memory cell will not collide with each other on a data bus.

In the DRAM, write and read columns are both selected via a common column select line and a read column select gate thus also turns on when data is written. To prevent such an erroneous read, the read sense transistor must be disconnected from the ground node. Accordingly, a transistor may be provided at an end of the memory cell array to connect to the ground node a single common line crossing multiple bit line pairs and connecting with all of the sources of the transistors.

However, the common line, connected to the ground node only at an end of the memory cell array, has a relatively high impedance. As such, when a large number of read sense transistors simultaneously operate, the common line has a potential floating above the ground potential, disadvantageously resulting in a significantly reduced current driving capability of the transistors.

Furthermore, since not only the write column select gate but also a read column select gate are turned on in writing data, even with the common line disconnected from the ground node the read sense transistor also slightly turns on, disadvantageously resulting in an erroneous read.

While such disadvantages are not so serious for a DRAM with a narrow bandwidth, they cannot be ignored for a bandwidth increased to achieve rapid data transfer.

SUMMARY OF THE INVENTION

An object of the present invention is to provide a semiconductor memory device configured with an I/O separation to reduce unnecessary current flowing to a read sense transistor in writing data.

In accordance with the present invention, a semiconductor memory device includes a memory cell array, a plurality of blocks, and a plurality of voltage control circuits. The memory cell array is divided into a plurality of subarrays. The plurality of blocks are associated with the plurality of subarrays. The plurality of voltage control circuits are associated with the plurality of blocks. Each subarray includes a memory cell, and a bit line pair connected to the memory cell. Each block includes a sense amplifier, an input/output line pair, a write column select gate, an output line pair, a first transistor, a second transistor, a read column select gate, and a column select line. The sense amplifier is connected to the bit line pair. The write column select gate is connected between the input/output line pair at the bit line pair. The first transistor has its gate connected to one of the paired bit lines. The second transistor has its gate connected to the other of the paired bit lines. The read column select gate is connected between the output line pair and the drains of the first and second transistors. The column select line is connected to commonly to the read column select gate and the write column select gate. The voltage control circuit supplies a ground voltage to the sources of the first and second transistors when data is read from a memory cell, and the voltage control circuit supplies a voltage higher than the ground voltage when data is written in a memory cell.

Preferably, the plurality of subarrays are arranged in rows and columns. The semiconductor memory device also includes a plurality of first regions arranged along a row between the subarrays, and a plurality of second regions arranged along a column between the subarrays. The voltage control circuit is arranged at an intersection of the first and second regions.

In the semiconductor memory device, in writing data a voltage higher than the ground voltage is supplied to the sources of the first and second transistors. Thus, the transistors are hardly turned on. As a result, in writing the data a reduced current flows from the output line pair into the transistors.

Furthermore, the plurality of voltage control circuits corresponding to the plurality of subarrays ensure that the above transistors have a source voltage equal to the ground voltage in reading data and a voltage higher than the ground voltage in writing data.

Furthermore, the voltage control circuit arranged at an intersection of the first and second regions allows a reduced layout area otherwise increased due to the voltage control circuit.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Figure 1:
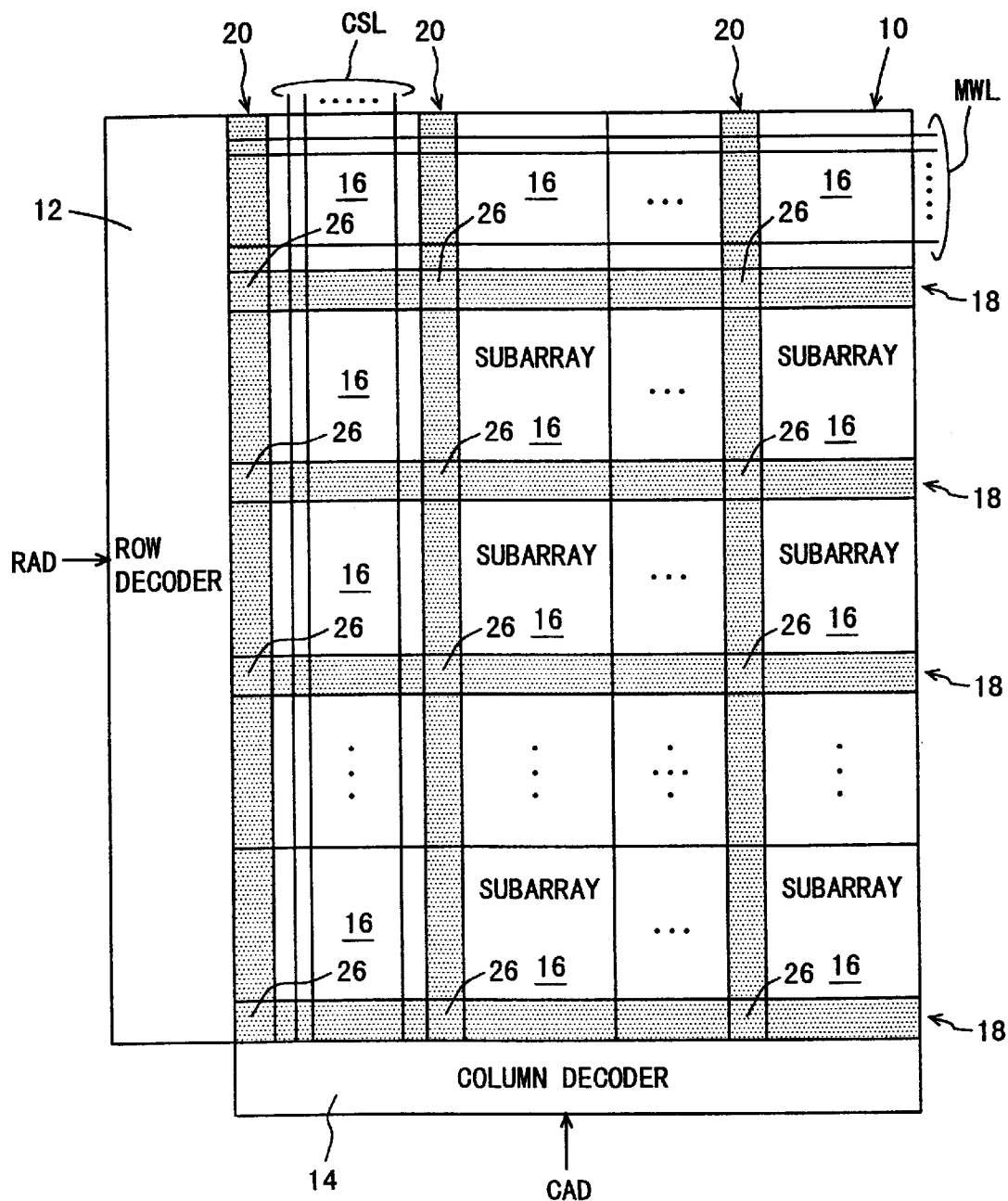
FIG. 1 is a layout of an entire configuration of a DRAM of a first embodiment of the present invention.

The embodiments of the present invention will now be specifically described with reference to the drawings. It should be noted that identical or corresponding portions are denoted by same reference characters and a description thereof will not be repeated.

First Embodiment

FIG. 1 is a layout showing an entire configuration of a DRAM of a first embodiment of the present invention.

Referring to FIG. 1, the DRAM includes a memory cell array 10, a plurality of main word lines MWLs arranged in rows across the entirety of memory cell array 10, a plurality of column select lines CSLs arranged in columns across the entirety of memory cell array 10, a row decoder 12 connected to main word lines MWLs, and a column decoder 14 connected to column select lines CSLs. Row decoder 12 responds to a row address signal RAD by selectively activating main word line MWL. Column address decoder 14 responds to a column address signal CAD by selectively activating column select line CSL.

Memory cell array 10 is divided into a plurality of subarrays 16 arranged in rows and columns. A plurality of sense amplifier regions 18 are arranged between the rows of subarrays 16. A plurality of subordinate decoder regions 20 are arranged between the columns of subarrays 16.

Figure 2:
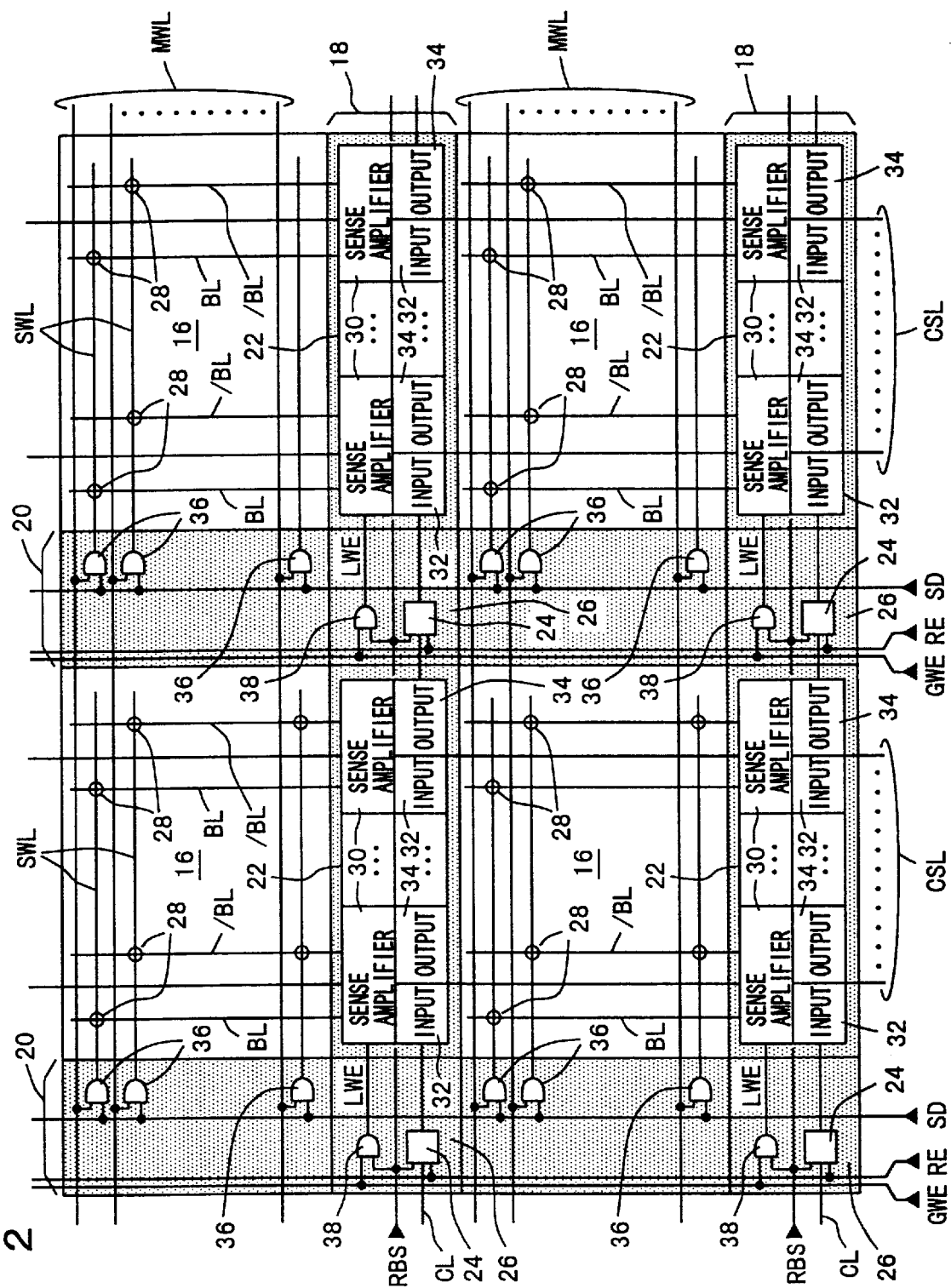
FIG. 2 is a circuit block diagram showing a detailed configuration of four subarrays and the sense amplifier region and subordinate decoder region adjacent thereto shown in FIG. 1.

FIG. 2 is a circuit block diagram specifically showing four subarrays 16, and a sense amplifier region 18 and a subordinate decoder region 20 both adjacent thereto.

Referring to FIG. 2, a plurality of sense amplifier blocks 22 are provided for the plurality of subarrays 16, respectively. Sense amplifier block 22 is arranged in sense amplifier region 18. A plurality of voltage control circuits 24 are provided for the plurality of sense amplifier blocks 22, respectively. Voltage control circuit 24 is arranged at an intersection 26 of sense amplifier region 18 and subordinate decoder region 20.

Each subarray 16 includes a plurality of memory cells 28 arranged in rows and columns, a plurality of subword lines SWLs arranged in rows, and a plurality of paired bit lines BL and /BL arranged in columns. Each memory cell 28 is connected to its associated subword line SWL and bit line BL or /BL.

Each sense amplifier block 22 includes a plurality of sense amplifiers 30 associated with the plurality of pairs of bit lines BL, /BL, respectively, a plurality of input circuits 32 associated with the plurality of sense amplifiers 30, respectively, and a plurality of output circuits 34 associated with the plurality of sense amplifiers 30, respectively. Each sense amplifier 30 is connected to its associated pair of bit lines BL, /BL to amplify a potential difference caused on the pair of bit lines BL, /BL.

In subordinate decoder region 20, a plurality of subdecoders 36 are arranged, associated with the plurality of subword lines SWLs, respectively. Each main word line MWL connects with a plurality of subdecoders 36. Each subword line SWL is connected to a respective subdecoder 36. Subdecoder 36 selectively activates subword line SWL in response to a voltage of main word line MWL and a subordinate decode signal SD. That is, this DRAM adopts a configuration with so-called divided word lines, also referred to as a "hierarchical word-line configuration".

At each intersection 26 is also arranged an AND circuit 38 producing a local write enable signal LWE in response to a global write enable signal GWE and a select control signal RBS. A signal line for global write enable signal GWE runs on subordinate decoder region 20 parallel to column select line CSL. A signal line for select control signal RBS runs on sense amplifier region 18 parallel to main word line MWL.

A plurality of common lines CLs are also arranged, associated with the plurality of sense amplifier regions 18, respectively. Common line CL runs across the entirety of memory cell array 10 on sense amplifier region 18 parallel to main word line MWL. Each common line CL is connected to a plurality of voltage control circuits 24 arranged on its respective sense amplifier region 18. Voltage control circuit 24 responds to select control signal RBS and read enable signal RE by supplying to common line CL a ground voltage or a predetermined voltage higher than the ground voltage. Voltage control circuit 24 will be described in detail later.

Figure 3:
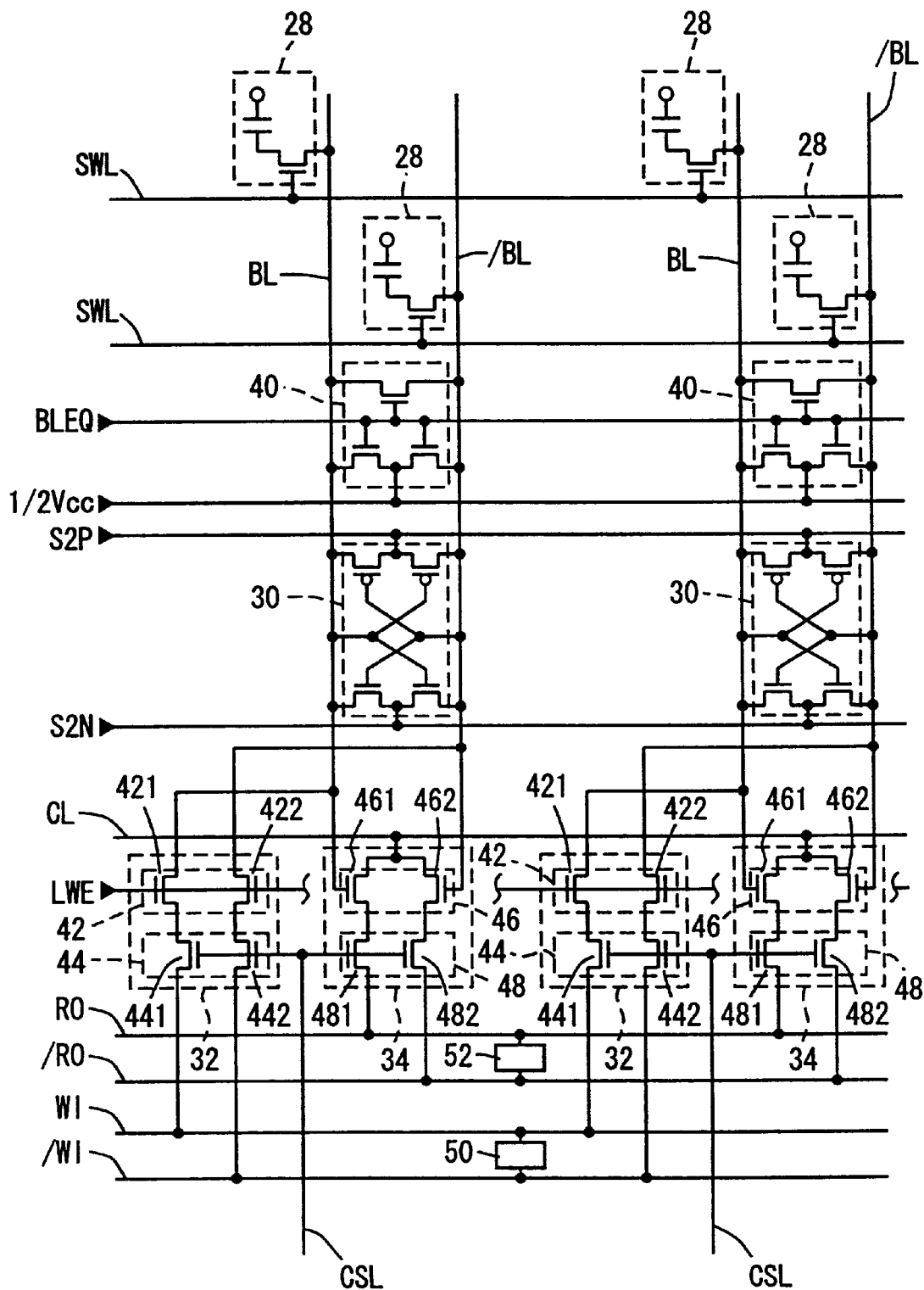
FIG. 3 is a circuit diagram showing a detailed configuration of each subarray and a sense amplifier block associated therewith shown in FIG. 2

FIG. 3 is a circuit diagram showing a detailed configuration of each subarray and sense amplifier block 22 associated therewith shown in FIG. 2.

Referring to FIG. 3, a plurality of precharge circuits 40 are provided, associated with the plurality of pairs of bit lines BL and /BL, respectively. Each precharge circuit 40 is connected to a respective pair of bit lines BL, /BL. Precharge circuit 40 responds to a bit line equalization signal BLEQ by precharging bit line pair BL, /BL to an intermediate voltage of VCC/2 and also equalizing the bit line pair. Intermediate voltage VCC/2 is a voltage between a power supply voltage VCC and the ground voltage.

Sense amplifier 30 responds to sense amplifier drive signals S2P and S2N by amplifying a potential difference developed on bit line pair BL, /BL. As a result, one of bit lines BL and /BL attains power supply voltage VCC and the other of bit lines BL, /BL attains the ground voltage.

As shown in FIG. 3, each sense amplifier block 22 shown in FIG. 2 includes a pair of input lines WI, /WI and a pair of output lines RO, /RO, as well as sense amplifier 30, input circuit 32 and output circuit 34. Each input circuit 32 is connected between a respective bit line pair BL, /BL and input line pair WI, /WI. Each output circuit 34 is connected between a respective bit line pair BL, /BL and output line pair RO, /RO.

Each input circuit 32 includes a write gate 42 and a write column select gate 44. Each write gate 42 includes a pair of n channel MOS transistors 421, 422. Transistor 421 has its drain connected to bit line BL. Transistor 422 has its drain connected to bit line /BL. Transistors 421 and 422, arranged on sense amplifier region 18, commonly receive local write enable signal LWE at their respective gates.

Each write column select gate 44 includes a pair of n channel MOS transistors 441, 442. Transistor 441 has its source connected to the drain of transistor 421. Transistor 441 has it drain connected to input line WI. Transistor 442 has its source connected to the drain of transistor 422. Transistor 442 has its drain connected to input line /WI.

Each output circuit 34 includes a read gate 46 and a read column select gate 48. Each read gate 46 includes a pair of n channel MOS transistors 461, 462. Transistor 462 has its gate connected to bit line BL. Transistor 461 has its source connected to common line CL. Transistor 462 has its gate connected to bit lines /BL. Transistor 462 has its source connected to common line CL. Each read column select gate 48 includes a pair of n channel MOS transistors 481, 482. Transistor 481 has its source connected to the drain of transistor 461. Transistor 481 has its drain connected to output line RO. Transistor 482 has its source connected to the drain of transistor 462. Transistor 482 has its drain connected to output line /RO.

The above four transistors 441, 442, 481, 482 have their respective gates connected commonly to a respective column select line CSL.

Input line pair WI, /WI connects with precharge circuit 50. Precharge circuit 50 precharges input line pair WI, /WI to power supply voltage VCC when data is not written. Output line pair RO, /RO connects with precharge circuit 52. Precharge circuit 52 precharges output line pair RO, /RO to power supply voltage VCC when data is not read.

Figure 4:
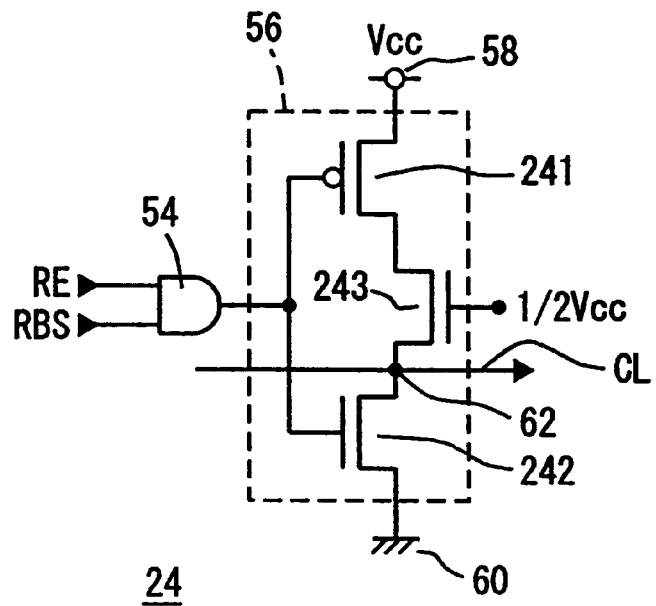
FIG. 4 is a circuit diagram showing a configuration of each voltage control circuit shown in FIG. 2.

FIG. 4 is a circuit diagram showing a detailed configuration of each voltage control circuit 24 shown in FIG. 2.

Referring to FIG. 4, each voltage control circuit 24 includes an AND circuit 54 receiving the above-described read enable signal RE and select control signal RBS, and a CMOS inverter circuit 56 receiving a signal output from AND circuit 54. CMOS inverter circuit 56 is connected between a power supply node 58 and a ground node 60. Inverter circuit 56 includes a p channel MOS transistor 241 and an n channel MOS transistor 242. Inverter circuit 56 also includes an n channel MOS transistor 243. Transistor 243 has its drain connected to the drain of transistor 241. Transistor 243 has its source connected to an output node of inverter circuit 56. Transistor 243 receives intermediate voltage VCC/2 at its gate. Output node 62 is connected to the aforementioned common line CL.

When read enable signal RE and select control signal RBS both go logical high, inverter circuit 56 supplies the ground voltage to output node 62. When either read enable signal RE or select control signal RBS goes logical low, inverter circuit 56 supplies intermediate voltage VCC/2 minus a threshold voltage Vth of transistor 243, i.e., a voltage (VCC/2−Vth) to output node 62. Thus, voltage control circuit 24 supplies the ground voltage to common line CL in reading data and a voltage (VCC/2−Vth), which is higher than the ground voltage, commonly to common lines CLs in writing data.

Preferably, transistor 243 is a transistor having a relatively low threshold, such as used in sense amplifier 30.

Read and write operations of the DRAM configured as above will now be described. The read operation will first be described.

In reading data, read enable signal RE goes high and global write enable signal GWE goes low. Since global write enable signal GWE goes low, local write enable signal LWE also goes low. Thus, transistors 421 and 422 configuring write gate 42 shown in FIG. 3 are all turned off.

Furthermore, select control signal RBS is selectively activated and any one of select control signal RBS goes high. Such high-level select control signal RBS is applied to multiple voltage control circuits 24 arranged on a respective sense amplifier region 18. As has been descried above, when voltage control circuit 24 receives high-level read enable signal RE and high-level select control signal RBS, voltage control circuit 24 supplies the ground voltage to a respective common line CL. Thus, transistors 461, 462 configuring read gate 46 shown in FIG. 3 have a source voltage fixed to the ground voltage.

Then, column decoder 14 shown in FIG. 1 selectively activates column select line CSL and any one of column select lines CSLs goes high. When column select line CSL voltage goes high, transistors 481, 482 configuring a respective read column select gate turn on and transistors 441, 442 configuring write column select gate 44 also turn on.

As a result, a potential difference developed on bit line pair BL, /BL is sensed by read gate 46 and data from memory cell 28 is thus read on output line pair RO, /RO via read column select gate 48.

The write operation will now be described.

In writing data, global write enable signal GWE goes high and read enable signal RE goes low. Thus, local write enable signal LWE running any one of sense amplifier regions 18 goes high. When the high-level local write enable signal LWE is applied to the corresponding, plurality of write gates 42, transistors 421, 422 configuring write gates 42 are all turned on.

Since read enable signal RE goes low, voltage control circuit 24 supplies voltage (VCC/2−Vth) to common line CL, as has been described above. Thus, transistors 461, 462 configuring all read gates 46 have a source voltage charged to voltage (VCC/2−Vth).

Then, when any one of column select lines CSLs goes high, transistors 481, 482 configuring a corresponding read column select gate 48 and transistors 441, 442 configuring write column select gate 44 are all turned on.

Thus, data on input line pair WI, /WI is transmitted via write column select gate 44 and write gate 42 to bit line pair BL, /BL and written in memory cell 28.

Meanwhile, output line pair RO, /RO has been precharged to power supply voltage VCC by precharge circuit 52. Since read column select gate 48 also turns on, transistors 461, 462 configuring read gate 46 have a drain voltage reaching power supply voltage VCC.

As such, if transistors 461, 462, have a source voltage remaining fixed at the ground voltage, read gate 46 will have a sufficient current driving capability and sense a potential difference developed on a corresponding bit line pair BL, /BL and the data on bit line pair BL, /BL will be erroneously read onto output line pair RO, /RO.

In fact, however, transistors 461, 462 in writing data have a source voltage charged to the voltage (VCC/2−Vth). Thus read gate 46 hardly has a current driving capability and such an erroneous read described above does not occur. Furthermore, when bit line pair BL, /BL is precharged to intermediate voltage VCC/2, transistor 461 or 462 does not turn on nor does current leak from output line pair RO, /RO via read select gate 48, read gate 46 to common line CL to discharge output line pair RO, /RO.

As such, in the first embodiment, when read column select gate 48 turns on in writing data, transistors 461, 462 configuring read gate 46 that have a source voltage charged to voltage (VCC/2−Vth) can prevent erroneous read operation and also prevent unnecessary current from leaking via read gate 46.

Furthermore a plurality of voltage control circuits 24 connected to a respective one of common line CL extending on sense amplifier region 18 ensure that transistors 461, 462 are charged to the ground voltage or voltage (VCC/2−Vth).

Furthermore, voltage control circuit 24 arranged at intersection 26 can also prevent the layout area from significantly increasing when voltage control circuit 24 is added.

Second Embodiment

Figure 5:
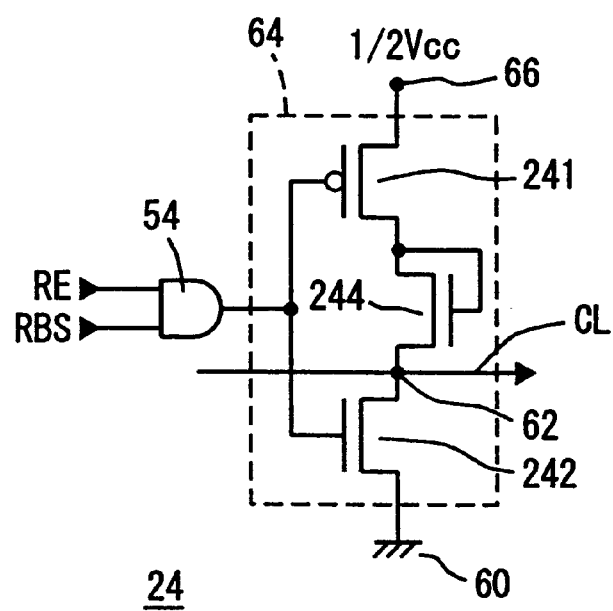
FIG. 5 is a circuit diagram showing a configuration of each voltage control circuit in a DRAM of a second embodiment of the present invention.

FIG. 5 is a circuit diagram showing another example of voltage control circuit 24. The FIG. 5 voltage control circuit 24 includes a CMOS inverter circuit 64 shown in FIG. 5 in place of CMOS inverter circuit 56 shown in FIG. 4. Inverter circuit 64 includes a diode-connected, n channel MOS transistor 244 in place of transistor 243 shown in FIG. 4. Transistor 244 has its drain connected to the drain of transistor 241. Transistor 244 has its source connected to output node 62 of inverter circuit 64. Inverter circuit 64 is connected between an intermediate voltage node 66 receiving intermediate voltage VCC/2 and ground node 60.

When read enable signal RE and select control signal RBS both go high, voltage control circuit 24 supplies a ground voltage to common line CL. When read enable signal RE or select control signal RBS goes low, voltage control circuit 24 supplies intermediate voltage VCC/2 minus a threshold voltage Vth of transistor 244, i.e., a voltage (VCC/2−Vth) to common line CL.

As is similar to transistor 243 shown in FIG. 4, transistor 244 is preferably a transistor having a relatively low threshold.

While in the above embodiments input line pair WI, /WI and output line pair RO, /RO that are shared by a plurality of bit line pairs run on sense amplifier region 18, to simultaneously input and output data of a larger number of bits one input line pair and one output line pair that are associated with a small number of bit line pairs may run on subarray 16 parallel to column select line CSL.

Furthermore, while in the above embodiments voltage control circuit 14 is arranged at every intersection 26, it may be alternatively arranged, e.g., only in each intersection 26 located at opposite ends of memory cell array 10, since common line CL is arranged across the entirety of memory cell array 10.

Furthermore, while in the above embodiments common line CL is arranged across the entirety of memory cell arrays 10, it may be alternatively divided, e.g., for each subarray 16 or each sense amplifier block 22, since each divided common line connects with a respective voltage control circuit 24.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor memory device comprising:
   a memory cell;
   a bit line pair connected to said memory cell;
   an input line pair;
   a write column select gate connected between said input line pair and said bit line pair;
   an output line pair;
   a first transistor having its gate connected to one bit line of said bit line pair;
   a second transistor having its gate connected to the other bit line of said bit line pair;
   a read column select gate connected between said output line pair and drains of said first and second transistors;
   a column select line connected commonly to said read column select gate and said write column select gate; and
   a voltage control circuit supplying to sources of said first and second transistors a ground voltage in reading data from said memory cell and a voltage higher than said ground voltage in writing data in said memory cell.

2. The semiconductor memory device according to claim 1, wherein said voltage control circuit includes a CMOS inverter circuit including p and n channel MOS transistors.

3. The semiconductor memory device according to claim 2, wherein said CMOS inverter circuit further includes a transistor connected between the drain of said p channel MOS transistor and an output node of said CMOS inverter circuit and having its gate receiving a voltage intermediate between a power supply voltage and a ground voltage.

4. The semiconductor memory device according to claim 3, wherein said CMOS inverter circuit is connected between a power supply node and a ground node.

5. The semiconductor memory device according to claim 2, wherein said CMOS inverter circuit further includes a diode-connected transistor connected between the drain of said p channel MOS transistor and an output node of said CMOS inverter circuit.

6. The semiconductor memory device according to claim 5, wherein said CMOS inverter circuit is connected between a ground node and a node receiving a voltage intermediate between a power supply voltage and a ground voltage.

7. A semiconductor memory device comprising:
   a memory cell array divided into a plurality of subarrays;
   a plurality of column select lines;
   a plurality of blocks corresponding to said plurality of subarrays; and
   a plurality of voltage control circuits corresponding to said plurality of blocks,
   said subarrays each including
      a memory cell, and
      a bit line pair connected to said memory cell,
   said blocks each including
      a sense amplifier connected to said bit line pair,
      an input line pair,
      a write column select gate connected to a corresponding one of said column select lines and connected between said input line pair and said bit line pair,
      an output line pair,
      a first transistor having its gate connected to one bit line of said bit line pair,
      a second transistor having its gate connected to the other bit line of said bit line pair, and
      a read column select gate connected commonly to said one column select line and connected between said output line pair and drains of said first and second transistors,
   said voltage control circuit supplying to sources of said first and second transistors a ground voltage in reading data from said memory cell and a voltage higher than said ground voltage in writing data to said memory cell.

8. The semiconductor memory device according to claim 7, wherein said plurality of subarrays are arranged in rows and columns, and said semiconductor memory device further comprises:
   a plurality of first regions arranged in rows between said subarrays; and
   a plurality of second regions arranged in columns between said subarrays; wherein
   said voltage control circuit is arranged in an intersection of said first and second regions.

9. The semiconductor memory device according to claim 8, further comprising:

a row decoder;

a plurality of main word lines connected to said row decoder; and a plurality of subdecoders connected to each of said main word lines; wherein:

said subarrays each include a plurality of subword lines connected to said subdecoder;

said block is arranged in said first region; and said subdecoder is arranged in said second region.

10. The semiconductor memory device according to claim 7, wherein said voltage control circuits each include a CMOS inverter circuit including p and n channel MOS transistors.

11. The semiconductor memory device according to claim 10, wherein said CMOS inverter circuit further includes a transistor connected between the drain of said p channel MOS transistor and an output node of said CMOS inverter circuit and having its gate receiving a voltage intermediate between a power supply voltage and a ground voltage.

12. The semiconductor memory device according to claim 11, wherein said CMOS inverter circuit is connected between a power supply node and a ground node.

13. The semiconductor memory device according to claim 10, wherein said CMOS inverter circuit further includes a diode-connected transistor connected between the drain of said p channel MOS transistor and an output node of said CMOS inverter circuit.

14. The semiconductor memory device according to claim 13, wherein said CMOS inverter circuit is connected between a ground node and a node receiving a voltage intermediate between a power supply voltage and a ground voltage.

\* \* \* \* \*

UNITED STATES PATENT AND TRADEMARK OFFICE
CERTIFICATE OF CORRECTION

PATENT NO. : 6,137,740
DATED : October 24, 2000
INVENTOR(S) : Hideyuki Noda

Page 1 of 1

It is certified that error appears in the above-identified patent and that said Letters Patent is hereby corrected as shown below:

Column 8, claim 7,
Lines 47-48, change "said one column select line" to -- said corresponding one of said column select lines --.

Signed and Sealed this

Twentieth Day of November, 2001

Attest:

NICHOLAS P. GODICI
*Attesting Officer*  *Acting Director of the United States Patent and Trademark Office*